(12) United States Patent
Wyland

(10) Patent No.: US 8,681,500 B2
(45) Date of Patent: Mar. 25, 2014

(54) INTEGRATED CIRCUIT NANOTUBE-BASED SUBSRATE

(75) Inventor: Chris Wyland, Livermore, CA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 443 days.

(21) Appl. No.: 11/718,710

(22) PCT Filed: Nov. 4, 2005

(86) PCT No.: PCT/IB2005/053622
§ 371 (c)(1),
(2), (4) Date: Feb. 19, 2009

(87) PCT Pub. No.: WO2006/048843
PCT Pub. Date: May 11, 2006

(65) Prior Publication Data
US 2009/0213551 A1 Aug. 27, 2009

Related U.S. Application Data

(60) Provisional application No. 60/625,451, filed on Nov. 4, 2004.

(51) Int. Cl.
H05K 7/20 (2006.01)
H01L 23/34 (2006.01)

(52) U.S. Cl.
USPC ........... 361/708; 361/713; 361/718; 361/719; 361/723; 257/713; 257/717; 257/720

(58) Field of Classification Search
USPC .......... 361/708, 713, 718, 719, 723; 257/713, 257/717, 720
See application file for complete search history.

(56) References Cited

U.S. PATENT DOCUMENTS

| 4,495,378 | A | * | 1/1985 | Dotzer et al. | 174/252 |
| 4,994,316 | A | * | 2/1991 | Browne et al. | 428/209 |
| 5,450,286 | A | * | 9/1995 | Jacques et al. | 361/749 |
| 5,640,048 | A | * | 6/1997 | Selna | 257/738 |

(Continued)

FOREIGN PATENT DOCUMENTS

| JP | 2003-273482 | 5/2002 |
| JP | 2002-151811 | 9/2003 |
| JP | 2003-249613 | 9/2003 |

OTHER PUBLICATIONS

European Patent Office, Office Action of Aug. 26, 2010, Application No. 05 799 8692.2-2203,4 Pages.

(Continued)

*Primary Examiner* — Bradley Thomas
(74) *Attorney, Agent, or Firm* — Haynes and Boone, LLP

(57) ABSTRACT

Carbon nanotube material is used in an integrated circuit substrate. According to an example embodiment, an integrated circuit arrangement (100) includes a substrate (110) with a carbon nanotube structure (120) therein. The carbon nanotube structure is arranged in one or more of a variety of manners to provide structural support and/or thermal conductivity. In some instances, the carbon nanotube structure is arranged to provide substantially all structural support for an integrated circuit arrangement. In other instances, the carbon nanotube structure is arranged to dissipate heat throughout the substrate. In still other instances, the carbon nanotube structure is arranged to remove heat from selected portions of the carbon nanotube substrate.

24 Claims, 3 Drawing Sheets

(56) References Cited

U.S. PATENT DOCUMENTS

| | | | |
|---|---|---|---|
| 5,805,424 A * | 9/1998 | Purinton | 361/760 |
| 6,282,094 B1 * | 8/2001 | Lo et al. | 361/704 |
| 6,323,439 B1 * | 11/2001 | Kambe et al. | 174/262 |
| 6,359,341 B1 * | 3/2002 | Huang et al. | 257/778 |
| 6,376,908 B1 * | 4/2002 | Gaku et al. | 257/707 |
| 6,407,922 B1 * | 6/2002 | Eckblad et al. | 361/704 |
| 6,477,052 B1 * | 11/2002 | Barcley | 361/719 |
| 6,542,371 B1 * | 4/2003 | Webb | 361/708 |
| 6,582,979 B2 | 6/2003 | Coccioli et al. | 438/25 |
| 6,639,155 B1 * | 10/2003 | Bupp et al. | 174/260 |
| 6,818,972 B2 * | 11/2004 | Jimarez et al. | 257/674 |
| 6,829,823 B2 * | 12/2004 | Downes et al. | 29/852 |
| 6,856,016 B2 * | 2/2005 | Searls et al. | 257/720 |
| 6,864,571 B2 * | 3/2005 | Arik et al. | 257/712 |
| 6,891,724 B2 * | 5/2005 | De Lorenzo et al. | 361/704 |
| 6,924,335 B2 * | 8/2005 | Fan et al. | 524/495 |
| 6,947,285 B2 * | 9/2005 | Chen et al. | 361/708 |
| 6,965,513 B2 * | 11/2005 | Montgomery et al. | 361/679.46 |
| 6,994,584 B1 * | 2/2006 | Santana et al. | 439/485 |
| 7,024,764 B2 * | 4/2006 | Kresge et al. | 29/840 |
| 7,057,891 B2 * | 6/2006 | Ito et al. | 361/679.46 |
| 7,086,451 B2 * | 8/2006 | Leu et al. | 165/80.3 |
| 7,118,941 B2 * | 10/2006 | Zhang et al. | 438/122 |
| 7,168,484 B2 * | 1/2007 | Zhang et al. | 165/185 |
| 7,269,017 B2 * | 9/2007 | Berlin et al. | 361/719 |
| 7,378,745 B2 * | 5/2008 | Hayashi et al. | 257/778 |
| 7,438,844 B2 * | 10/2008 | Huang et al. | 264/261 |
| 7,476,967 B2 * | 1/2009 | Dubin | 257/706 |
| 7,535,715 B2 * | 5/2009 | Chung | 361/707 |
| 7,538,422 B2 * | 5/2009 | Dangelo et al. | 257/706 |
| 7,567,414 B2 * | 7/2009 | Bertin et al. | 361/56 |
| 7,656,027 B2 * | 2/2010 | Dangelo et al. | 257/713 |
| 7,738,942 B2 * | 6/2010 | Weiner et al. | 600/411 |
| 7,784,531 B1 * | 8/2010 | Li et al. | 165/185 |
| 7,800,908 B2 * | 9/2010 | Schulz-Harder et al. | 361/708 |
| 7,878,232 B2 * | 2/2011 | Arik et al. | 165/80.2 |
| 7,898,079 B2 * | 3/2011 | Lashmore et al. | 257/720 |
| 8,039,953 B2 * | 10/2011 | Dangelo | 257/720 |
| 2002/0034066 A1 * | 3/2002 | Huang et al. | 361/704 |
| 2002/0084524 A1 * | 7/2002 | Roh et al. | 257/738 |
| 2002/0157859 A1 * | 10/2002 | Vasoya et al. | 174/250 |
| 2002/0163079 A1 * | 11/2002 | Awano | 257/750 |
| 2003/0096104 A1 * | 5/2003 | Tobita et al. | 428/332 |
| 2003/0104652 A1 * | 6/2003 | LeBonheur et al. | 438/108 |
| 2003/0111333 A1 * | 6/2003 | Montgomery et al. | 204/164 |
| 2003/0117770 A1 * | 6/2003 | Montgomery et al. | 361/687 |
| 2003/0209802 A1 * | 11/2003 | Awano | 257/712 |
| 2003/0230799 A1 * | 12/2003 | Yee et al. | 257/706 |
| 2004/0005736 A1 * | 1/2004 | Searls et al. | 438/122 |
| 2004/0053053 A1 * | 3/2004 | Jiang et al. | 428/408 |
| 2004/0066610 A1 * | 4/2004 | Miyachi et al. | 361/679 |
| 2004/0097635 A1 * | 5/2004 | Fan et al. | 524/496 |
| 2004/0101468 A1 * | 5/2004 | Liu et al. | 423/447.3 |
| 2004/0108589 A1 * | 6/2004 | Heilbronner | 257/706 |
| 2004/0125565 A1 * | 7/2004 | Chen et al. | 361/704 |
| 2004/0131835 A1 * | 7/2004 | Schmitt et al. | 428/293.1 |
| 2004/0150100 A1 * | 8/2004 | Dubin et al. | 257/720 |
| 2004/0152240 A1 * | 8/2004 | Dangelo | 438/122 |
| 2004/0261987 A1 * | 12/2004 | Zhang et al. | 165/183 |
| 2004/0265489 A1 * | 12/2004 | Dubin | 427/212 |
| 2004/0266063 A1 * | 12/2004 | Montgomery et al. | 438/119 |
| 2004/0266065 A1 * | 12/2004 | Zhang et al. | 438/122 |
| 2005/0006754 A1 * | 1/2005 | Arik et al. | 257/712 |
| 2005/0046017 A1 * | 3/2005 | Dangelo | 257/720 |
| 2005/0061496 A1 * | 3/2005 | Matabayas, Jr. | 165/185 |
| 2005/0116336 A1 * | 6/2005 | Chopra et al. | 257/720 |
| 2005/0126766 A1 * | 6/2005 | Lee et al. | 165/133 |
| 2005/0136248 A1 * | 6/2005 | Leu et al. | 428/332 |
| 2005/0139642 A1 * | 6/2005 | Koning et al. | 228/245 |
| 2005/0139991 A1 * | 6/2005 | White et al. | 257/706 |
| 2005/0167647 A1 * | 8/2005 | Huang et al. | 257/14 |
| 2005/0186704 A1 * | 8/2005 | Yee et al. | 438/106 |
| 2005/0215049 A1 * | 9/2005 | Horibe et al. | 438/622 |
| 2005/0238810 A1 * | 10/2005 | Scaringe et al. | 427/249.1 |
| 2005/0248924 A1 * | 11/2005 | Farrow et al. | 361/704 |
| 2005/0260412 A1 * | 11/2005 | Gardner | 428/408 |
| 2005/0269726 A1 * | 12/2005 | Matabayas, Jr. | 264/104 |
| 2005/0270744 A1 * | 12/2005 | Farrow et al. | 361/704 |
| 2006/0022221 A1 * | 2/2006 | Furukawa et al. | 257/222 |
| 2006/0090885 A1 * | 5/2006 | Montgomery et al. | 165/104.33 |
| 2006/0091552 A1 * | 5/2006 | Breit et al. | 257/762 |
| 2006/0098382 A1 * | 5/2006 | Miyagawa et al. | 361/272 |
| 2006/0220227 A1 * | 10/2006 | Marro | 257/723 |
| 2006/0226551 A1 * | 10/2006 | Awano | 257/773 |
| 2006/0246276 A1 * | 11/2006 | Chung | 428/323 |
| 2006/0289989 A1 * | 12/2006 | Yee et al. | 257/720 |
| 2007/0102809 A1 * | 5/2007 | Dubin | 257/713 |
| 2007/0114657 A1 * | 5/2007 | Dangelo et al. | 257/720 |
| 2007/0114658 A1 * | 5/2007 | Dangelo et al. | 257/720 |
| 2008/0144287 A1 * | 6/2008 | Shigaki et al. | 361/704 |

OTHER PUBLICATIONS

Japanese Patent Office, Office Action dated Jun. 7, 2011, Application No. 2007-539699, 3 pages.

Korean Patent Office, Office Action dated Sep. 29, 2011, Application No. 2007-7012610, 9 pages including English translation.

* cited by examiner

INTEGRATED CIRCUIT NANOTUBE-BASED SUBSRATE

CROSS REFERENCE TO RELATED APPLICATIONS

This application is a United States national phase of co-pending international patent application No. PCT/IB2005/053622, filed Nov. 4, 2005 which claims benefit of U.S. provisional application No. 60/625,451, filed Nov. 4, 2004, the disclosures of which are incorporated herein by reference.

The present invention is directed to integrated circuit devices and approaches and, more particularly, to integrated circuit substrates employing nanotube material.

Substrate material plays an important role in the manufacture and implementation of circuits. For example, integrated circuits, flip-chip type circuits and others are often mounted upon a substrate having conductive lines therein, using a soldering type connection to both electrically and physically couple the integrated circuits to the substrate. When used for supporting structures (e.g., ball grid arrays (BGAs) or printed circuit boards (PCBs)), the substrate typically holds and/or supports circuits and further acts to conduct signals between circuits coupled the supporting structures. In some instances, PCBs are referred to as including BGAs for connecting to other circuits.

Typical BGAs (and, similarly, PCBs) have a substrate-type material with conductive interconnects coupled with conductive pads on one or more surfaces of the substrate-type material. The interconnects typically include lateral trace lines (traces) connected with vertical conductive vias, with the traces often arranged in multiple layers to effect, with the vias, various connectivity between different conductive pads. A multitude of electronic components, such as flip-chip dies and other components, are connected to the BGA via the conductive pads. Depending upon the implementation, the interconnects connect different ones of the circuit components with each other and/or with other-circuits to which the BGA is coupled.

One example BGA application involves implementation with a flip-chip integrated circuit device. The BGA is mounted to external circuitry via soldered connections on a bottom surface of the BGA. The flip-chip integrated circuit device is soldered to an upper surface of the BGA and connected to the external circuitry via the interconnects connecting the lower and upper surface of the BGA.

With increased circuit density, as well as increased functionality, characterizing circuit designs, there is often a need for many interconnects (and many traces and vias) in a small area. In addition, there is often a need for greater power consumption to power the circuits. Increased density and/or power consumption generally leads to increased heat generation, which can pose potential problems for circuit components. In addition, as the size of circuit arrangements (and, correspondingly, substrates) is reduced, these substrates are often placed under increased stress.

These and other difficulties present challenges to the implementation of circuit substrates for a variety of applications.

Various aspects of the present invention involve substrates and/or packaging that can be implemented with integrated circuits and other devices. The present invention is exemplified in a number of implementations and applications, some of which are summarized below.

According to an example embodiment, carbon nanotube structures are implemented in a substrate to facilitate support and/or heat transfer with the substrate. Various applications of the substrate include, for example, integrated circuits, circuit boards, ball grid arrays (BGAs) and pin grid arrays (PGAs).

In one implementation, carbon nanotube structures are implemented in a BGA-type substrate to substantially enhance the strength of the substrate and, correspondingly, support circuits coupled thereto. The carbon nanotube structures (e.g., a mesh, array or other arrangement) extends across the BGA-type substrate and provides support to resist twisting, cracking and/or other stress-type challenges associated with such substrates.

In another implementation, the carbon nanotube structures are configured and arranged for transferring heat in a BGA-type substrate. Certain applications involve the arrangement of nanotubes in a manner to facilitate heat transfer in a particular direction, such as by orienting the nanotube structures (e.g., nanotubes or groupings of nanotubes such as fibers) in a particular direction in which heat transfer is desired.

In another example embodiment of the present invention, an integrated circuit chip arrangement includes a substrate with a supporting layer of carbon nanotube material therein. The substrate has a thickness and extends laterally perpendicular to the thickness, with an upper surface layer arranged for supporting circuits. The support layer of carbon nanotube material in the substrate is below the upper surface layer and structurally supports the substrate as well as any integrated circuits formed at the upper surface layer.

In another example embodiment of the present invention, a BGA-type circuit arrangement includes a carbon-nanotube enhanced substrate, extending laterally in length with upper and lower surface regions defining a thickness generally perpendicular to the length. The upper surface region of the substrate has conductive pads configured and arranged for coupling to integrated circuit chips. The lower surface region of the substrate has conductive pads configured and arranged for coupling to external circuits. A conductive interconnect system extends between and couples the conductive pads on the lower surface with conductive pads on the upper surface. Signals are thus passed between the conductive pads (e.g., and between a chip coupled at the upper surface region and circuitry to which the conductive pads on the lower surface region are coupled).

The enhanced substrate includes a carbon nanotube layer located vertically between the upper and lower surfaces and extending laterally across at least a portion of the substrate. The carbon nanotube layer includes carbon nanotubes in one or more of a variety of arrangements, which provide one or both of structural support for the substrate and heat transfer in the substrate (and, when appropriately arranged, out of the substrate). An electrically insulating material is arranged to insulate portions of the conductive interconnect system (interconnects and/or vias) that extend through the carbon nanotube layer. In some applications, the electrically insulating material is arranged physically between the carbon nanotube layer, or between carbon nanotubes in the layer, and the interconnect system. In other applications, the electrically insulating material is interspersed within the carbon nanotube support layer, such that the interconnect system may electrically couple to carbon nanotubes, but insulative material in the carbon nanotube layer inhibit electrical conductivity between carbon nanotubes in the carbon nanotube layer.

The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 3:
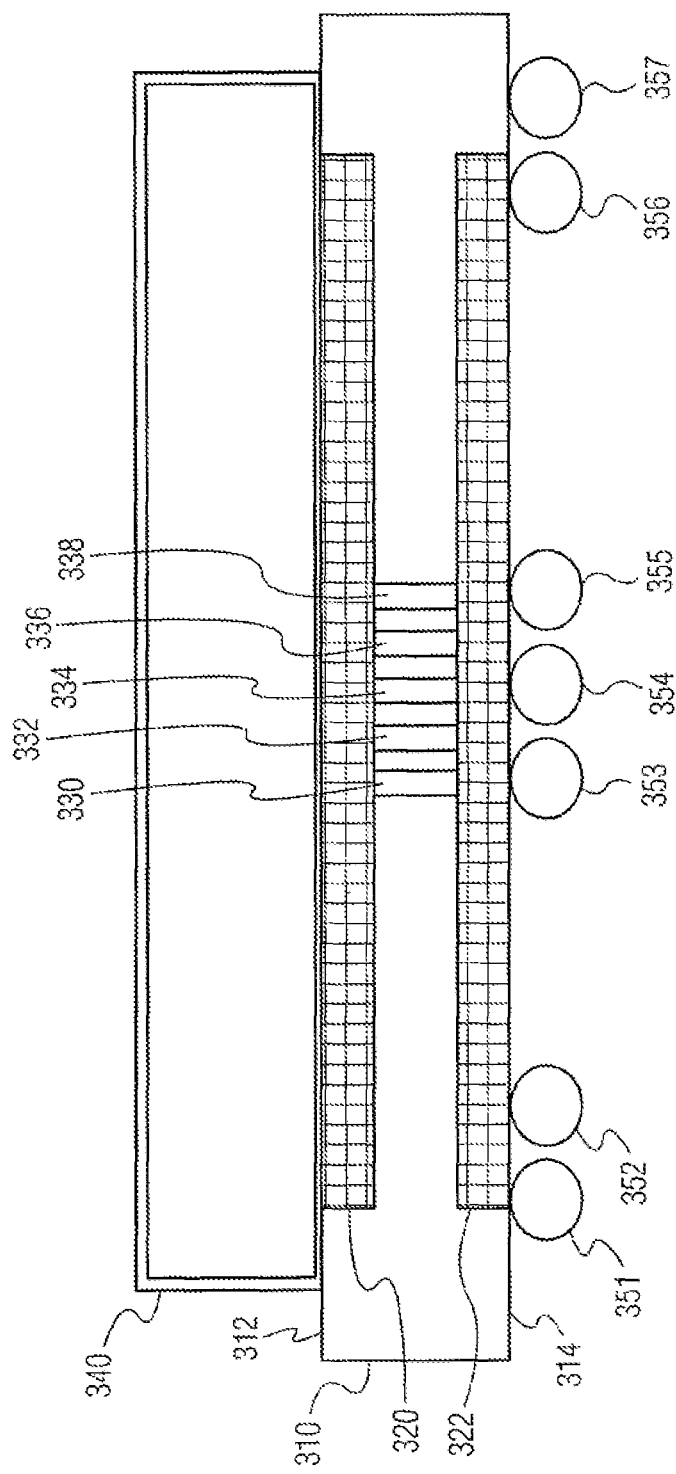
Figure 4:
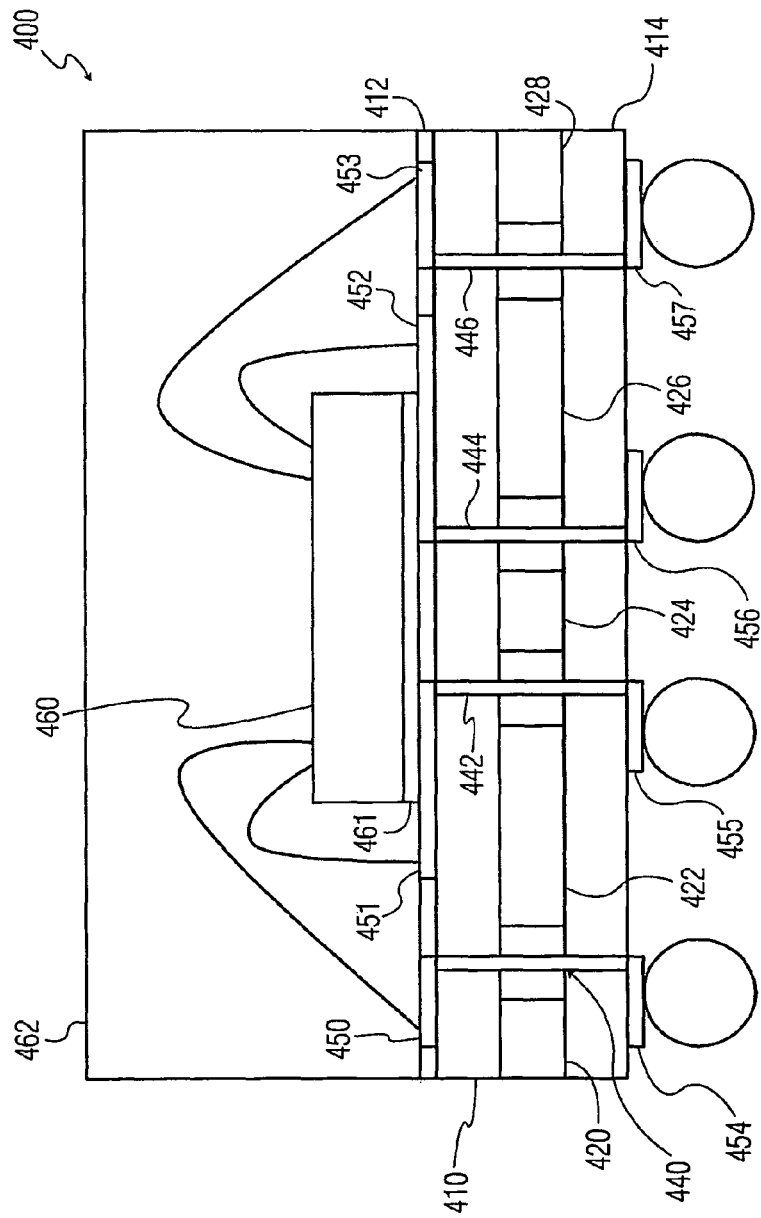

FIG. 3 is a cross-sectional view of a PCB arrangement with a combination of vertical and horizontal carbon nanotube conductive structures, according to another example embodiment of the present invention; and FIG. 4 shows a cross-sectional view of a circuit arrangement with nanotube-based heat dissipation structures adjacent, and insulated from, conductive interconnects and vias, according to another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving and/or benefiting from substrates, and in particular, from substrates exhibiting desirable strength and thermal conductivity. While the present invention is not necessarily limited to such applications, an appreciation of various aspects of the invention is best gained through a discussion of examples in such an environment.

According to an example embodiment of the present invention, a substrate for use with circuit arrangements such as a ball-grid array (BGA), printed circuit board (PCB) or other arrangement is implemented with a substrate including carbon nanotubes. These carbon nanotubes may include, for example, carbon nanotube fibers and both single-walled and multi-walled carbon nanotubes.

In one embodiment, the carbon nanotubes are used to support, or stiffen, the substrate. The carbon nanotube-stiffened substrate can then be used to support circuits, such as circuit interconnects, traces and vias, or an active circuit layer in a semiconductor wafer.

The quantity of carbon nanotubes in the substrate is selected to fit the particular application. For instance, where an electrically insulative substrate is desired, the quantity of carbon nanotubes is limited to a concentration in the substrate that is generally nonconductive for particular applications for which the substrate is contemplated. In some applications, the carbon nanotubes are used with other filler material, such as silica, to form the substrate. The ratio of carbon nanotubes to silica (or other substrate material) is selected to achieve a desirable conductivity (i.e., to inhibit electrical conduction while promoting thermal conduction).

In other applications, electrically insulative material is selectively placed in the substrate to electrically insulate circuits from the carbon nanotubes. This approach facilitates the use of a relatively high concentration of carbon nanotubes that, without the electrically insulative material, may conduct electricity to or from the circuits. Such a relatively high concentration of carbon nanotubes facilitates heat transfer in and/or out of the substrate.

In some instances, the carbon nanotubes provide substantial support for the substrate. For example, in some applications, the carbon nanotubes provide at least 20% of stiffness attributable to the substrate. In other applications, the substantial support provided by the carbon nanotubes provides over 50% of stiffness attributable to the substrate. In still other applications, the substantial support provided by the carbon nanotubes provides over 75% of stiffness attributable to the substrate.

In another embodiment, the carbon nanotubes are implemented for conducting thermal energy generated, e.g., by circuitry in the substrate and/or circuits coupled to the substrate, such as integrated circuit components. The carbon nanotubes are implemented in packaging for the circuit substrate, such as with the substrate itself and/or with other portions, such as with material used to bond circuit package components together.

For use with stiffening and/or thermal dissipation, the carbon nanotubes are arranged in a variety of manners. For example, the carbon nanotubes may be randomly or uniformly mixed throughout a substrate material such as silicon. As another example, the carbon nanotubes may be arranged in a particular orientation for achieving certain stiffness and/or thermal conductivity conditions. For instance, where bending or twisting of a supporting substrate such as a BGA substrate is desirably inhibited, the carbon nanotubes are arranged to inhibit the bending or twisting by resisting compression along the length of the carbon nanotubes. In some applications, the carbon nanotubes are thus arranged to provide stiffness in more than one direction, such as by arranging the carbon nanotubes in a truss-like or multi-directional arrangement.

In another example embodiment of the present invention, a matrix of carbon nanotubes is encapsulated in a substrate-type material, such as an epoxy. Substrate-type materials may include, for example, an FR4 epoxy and/or Bismaleimide triazin (BT) resin. The encapsulated matrix is accordingly amenable to metallization and hole making processes used for the creation of BGA and PCB substrates.

Figure 1:
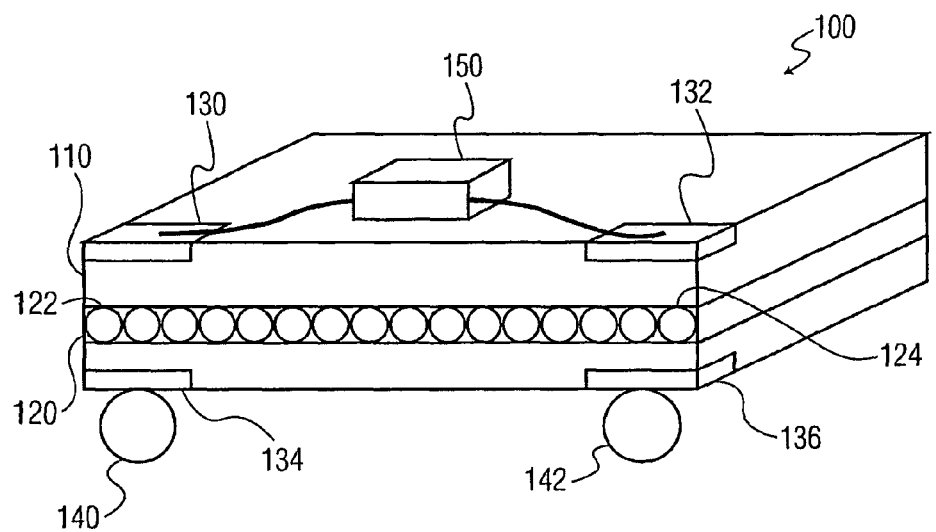
FIG. 1 shows a cut-away view of a BGA arrangement, according to an example embodiment of the present invention.

Turning now to the figures, FIG. 1 shows a cut-away view of a BGA arrangement 100 having a substrate 110 with a carbon nanotube layer 120 in a portion thereof, according to another example embodiment of the present invention. The BGA arrangement 100 further includes conductive pads at upper and lower surfaces thereof. The cut-away view in FIG. 1 shows pads 130 and 132 at an upper surface and pads 134 and 136 at a lower surface. Conductive contacts (e.g., solder balls) 140 and 142 are coupled to the pads 134 and 136 and further adapted for coupling for adjacent circuitry. The pads 130 and 132 at the upper surface are coupled to a circuit component 150 via electrical leads. The circuit component 150 may be implemented, for example, as an integrated circuit chip. The pads 130 and 132 couple the circuit component 150 to the contacts 140 and 142 via the pads 134 and 136 as well as interconnects in the substrate 110.

A plurality of carbon nanotube bundles 122-124 are shown in a generally lateral arrangement by way of example; a multitude of carbon nanotubes and nanotube arrangements are applicable for use with the carbon nanotube layer 120, as shown and otherwise. For example, the carbon nanotubes in the carbon nanotube layer 120 can be oriented in different manners to accommodate a particular application. In various embodiments, the carbon nanotubes are oriented randomly in the carbon nanotube layer 120 in the substrate 110 (e.g., in an epoxy layer in the substrate). In some embodiments, the carbon nanotubes are arranged in a manner that facilitates heat transfer in a particular direction and/or the dissipation of heat in the substrate 110. In other embodiments, the carbon nanotubes are arranged in a manner that provides structural support in a particular direction.

In one implementation, the carbon nanotube layer 120 includes a generally horizontal mesh of nanotube yarn and/or strings embedded in a resin. The generally horizontal nature of the carbon nanotube layer 120 aids in spreading heat horizontally; relative to the orientation of the BGA arrangement 100 in FIG. 1.

In another implementation, a vertical column array of carbon nanotubes is embedded in an epoxy resin. The vertical column array of carbon nanotubes may be implemented, for example, with the carbon nanotube layer 120 in FIG. 1. This vertical column approach facilitates heat transfer in a vertical direction, i.e., away from circuits near an upper surface of the substrate 110 and toward a lower portion of the substrate.

In other applications, a vertical carbon nanotube structure is arranged in a relatively narrow column (e.g., with a height: width ratio of 1:1 or greater) to facilitate significant heat transfer in a generally vertical direction. Referring to FIG. 1, this generally vertical heat transfer is relative, e.g., to heat transfer in a generally lateral (horizontal, as shown) direction as effected with the relatively wide carbon nanotube layer 120.

In another embodiment, a carbon nanotube layer makes up substantially an entire integrated substrate, with carbon nanotubes generally throughout the substrate and held together as discussed above (e.g., with an epoxy). Referring to FIG. 1 again as an example, the carbon nanotube layer 120 may be expanded to encompass the entire substrate 110, with the various circuit components (e.g., pads 130-136 and interconnects/vias between the pads) formed in the carbon nanotube layer.

In this embodiment, the circuit components are insulated from the carbon nanotube layer. In some applications, an insulative layer is formed between the carbon nanotube layer (e.g., nanotube-including epoxy) and circuit components. Referring to FIG. 1 again, the pads 130-136 as well as interconnects and vias therebetween can be lined with an insulative material. In other applications, the carbon nanotube layer itself is formed to be non-electrically conductive, with a sufficiently low concentration of carbon nanotubes to inhibit electrical conduction in the particular application to which the carbon nanotube layer is applied.

Figure 2:
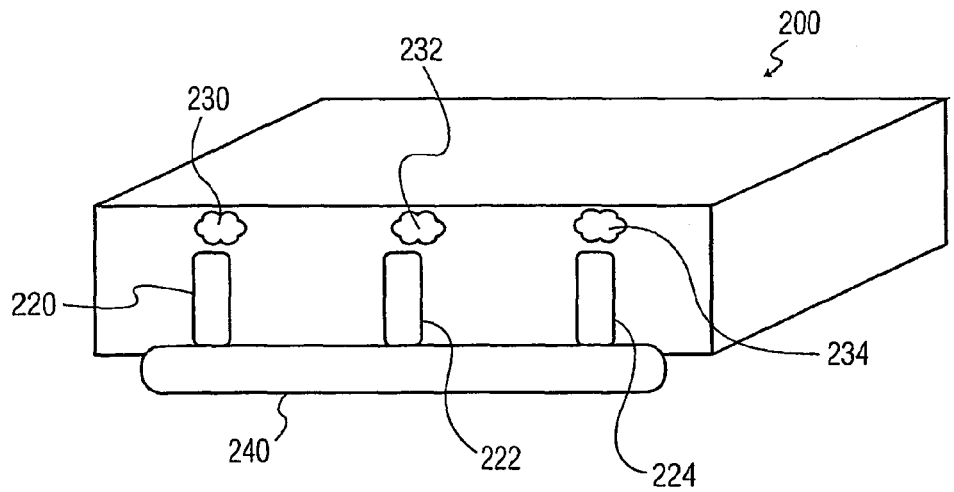
FIG. 2 is a cross-sectional view of a substrate arrangement with vertically arranged carbon nanotube structures, according to another example embodiment of the present invention.

FIG. 2 shows a cut-out view of a portion of a substrate 200 employing vertical carbon nanotube arrangements, according to another example embodiment of the present invention. The substrate 200 is applicable for use in a variety of circuit structures, such as with PCBs, BGAs, semiconductor substrates (e.g., for integrated circuit chips or flip-chips) and more. In this regard, the material used for the substrate 200 may be one or more of a variety of materials such as epoxy, resin or silicon-containing materials.

Relatively narrow columns 220, 222 and 224 of carbon nanotubes are arranged to aid in vertical heat transfer, e.g., as thermal vias in the substrate 200. This vertical arrangement can facilitate the transfer of heat from certain areas of the substrate and/or certain circuit elements, such as vias in the substrate 200 or circuit elements near an upper surface of the substrate (here, shown as elements 230, 232 and 234 by way of example).

When the substrate 200 is employed as a BGA type substrate, the carbon nanotube columns 220, 222 and/or 224 can be arranged to facilitate vertical heat transfer from interconnects near an upper surface of the substrate. When employed with integrated circuit type substrates, the carbon nanotube column(s) 220, 222 and/or 224 can be arranged near logic type circuit components and/or active regions in a substrate for facilitating heat transfer from these components and/or regions. In this regard, the shape, size and location of carbon nanotube columns such as columns 220, 222 and 224 can be specifically tailored to conduct heat from a particular location and in a particular direction in a substrate. For instance, one or more columns can be arranged to conduct heat away from circuit elements such as elements 230, 232 and/or 234.

In a further implementation, a heat sink 240 is coupled to one or more carbon nanotube structures, shown in FIG. 2 optionally connected to carbon nanotube columns 220, 222 and 224. The heat sink 240 includes thermally conductive material and is arranged to conduct thermal heat from carbon nanotube columns and away from the substrate 200. In some instances, the heat sink 240 is further cooled using, e.g., conductive heat transfer, convective beat transfer or other approaches.

FIG. 3 shows a cross-sectional view of a PCB (printed circuit board) substrate arrangement 300 with both vertically and horizontally arranged heat transfer structures, according to another example embodiment of the present invention. The PCB substrate structure 300 has a substrate 310, labeled as including BT resin by way of example, with upper and lower carbon nanotube mesh structures 320 and 322, respectively. Relatively vertical carbon nanotube conductive structures 330, 332, 334, 336 and 338 extend between the upper and lower carbon nanotube mesh structures 320 and 322 and conduct heat therebetween. The size, arrangement and number of carbon nanotube structures are shown by way of example in FIG. 3; however, a multitude of variations in-these and other related conditions (e.g., adding vertical carbon nanotube structures) are made for a variety of applications.

The upper carbon nanotube mesh structure 320 conducts heat from circuits and/or substrates coupled on an upper surface 312 of the substrate 310. The heat is further conducted from the upper carbon nanotube mesh structure 320 by the vertical carbon nanotube conductive structures 330-338, and to the lower carbon nanotube mesh structure 322. Conversely, heat can also be transferred in an opposite direction, from the lower carbon nanotube mesh structure 322 to the upper carbon nanotube mesh structure 320, via the vertical carbon nanotube conductive structures 330-338.

A variety of circuits can be implemented with the substrate arrangement 300. For instance, a semiconductor chip 340, shown by way of example, can be coupled to the substrate 310 using, e.g., pads as discussed with FIG. 1 above. The pads electrically couple the semiconductor chip 340 to contacts (e.g., solder balls 351-357) on the lower surface 314 of the substrate 310 by way of interconnects and/or vias in the substrate. Circuit interconnects and vias in the substrate arrangement 300 make the electrical connection between the semiconductor chip 340 and the contacts. In some applications, carbon nanotube conductive structures in the substrate 310 are arranged near the interconnects and/or vias in a manner that facilitates the conduction of heat therefrom.

FIG. 4 shows a cross-sectional view of a circuit arrangement 400 with nanotube-based heat dissipation structures adjacent and insulated from conductive interconnects and vias, according to another example embodiment of the present invention. A BT-resin type substrate 410 includes conductive carbon nanotube structures 420-428 extending generally laterally across the substrate 410. Each of the carbon nanotube structures 420-428 includes a mixture of carbon nanotubes and epoxy-type material.

A plurality of conductive traces and vias extend from an upper surface area 412 of the substrate 410 to a lower surface area 414 of the substrate. The shown vias include vias 440-

446 and the shown traces (or pads) include traces 450-453 at the upper surface area 412 and traces 454-457 at the lower surface area 414. The traces, or pads, 454-457 at the lower surface 414 are shown coupled to solder balls, by way of example.

Traces 450-453 at the upper surface 412 are coupled via bond wires and/or directly to circuit components on the upper surface. One such circuit component shows is a silicon chip 460, coupled to each of the traces 450-453 via bond wires. A lower portion 461 of the silicon chip 460 is optionally directly coupled to traces 451 or 452 (or others, e.g., located in a direction generally perpendicular to the shown cross-section).

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, the carbon nanotubes may be implemented with material different from, or in addition, to, carbon, such as Boron. In addition, the substrate-type materials discussed by way of example may be implemented with a multitude of different types of materials, used alone and/or in conjunction with one another or with the above-described materials. Such modifications and changes do not depart from the true spirit and scope of the present invention.

What is claimed is:

1. An integrated circuit chip arrangement comprising:
    a substrate having a thickness and extending laterally perpendicular to the thickness, the substrate having a topmost surface and a bottom surface, the bottom surface having a conductive pad;
    a first circuit disposed on the topmost surface of the substrate;
    a support layer of carbon nanotube material in the substrate and below the topmost surface, the support layer configured and arranged to structurally support the substrate and the first circuit, the carbon nanotube material embedded in an epoxy resin, wherein the support layer includes a top portion having a first set of carbon nanotubes elongated in a first direction, a bottom portion having a second set of carbon nanotubes elongated in the first direction, and a middle portion extending from the top portion to the bottom portion and having a third set of carbon nanotubes elongated in a second direction that is substantially perpendicular to the first direction, wherein the first set of carbon nanotubes are disposed closer to the topmost surface of the substrate and arranged for supporting the first circuit than the second and third sets of carbon nanotubes, wherein at least one carbon nanotube from the third set of carbon nanotubes physically contacts at least one carbon nanotube from the first set of carbon nanotubes and wherein the at least one carbon nanotube from the third set of carbon nanotubes physically contacts at least one carbon nanotube from the second set of carbon nanotubes.

2. The arrangement of claim 1, wherein the support layer includes a carbon nanotube matrix.

3. The arrangement of claim 2, wherein the carbon nanotube matrix includes a multitude of carbon nanotubes extending laterally across substantially all of the substrate.

4. The arrangement of claim 1, wherein the support layer is configured and arranged to disperse heat across the substrate.

5. The arrangement of claim 1, wherein the support layer extends laterally across substantially the entire substrate.

6. The arrangement of claim 1, wherein the support layer of carbon nanotube material is configured and arranged for dispersing heat in the substrate.

7. The arrangement of claim 6, wherein the support layer is configured and arranged to remove heat from a second circuit in the substrate.

8. The arrangement of claim 6, wherein the support layer is configured and arranged to remove heat from the first circuit that is coupled to the substrate.

9. The arrangement of claim 1, wherein the support layer is electrically insulated from a second circuit in the substrate.

10. The arrangement of claim 1, further comprising:
    at least one through via extending along an axis from the top surface of the substrate to the bottom surface of the substrate such that the through via extends through at least a portion of the support layer, the at least one through via physically contacting the conductive pad along the axis on the bottom surface; and
    insulative material configured and arranged for electrically insulating carbon nanotubes in the support layer from the at least one through via.

11. The arrangement of claim 1, wherein the first set of carbon nanotubes is arranged to direct heat away from selected portions of the topmost surface of the substrate to the third set of carbon nanotubes.

12. The arrangement of claim 11, wherein the second set of carbon nanotubes have a generally tubular structure with a length greater than a width and wherein the second set of carbon nanotubes is arranged to direct heat away from the selected portions of the bottom surface of the substrate to the third set of carbon nanotubes.

13. The arrangement of claim 1, wherein the third set of carbon nanotubes includes a plurality of carbon nanotubes having a generally tubular structure with a length greater than width, and wherein the third set of carbon nanotubes is arranged such that the length of the carbon nanotube provide substantial support to the structure in compression.

14. The arrangement of claim 1, further comprising a heat sink thermally coupled to the support layer of carbon nanotube material and arranged with the carbon nanotube material to remove heat from the substrate.

15. A circuit arrangement comprising:
    a substrate having a thickness and extending laterally perpendicular to the thickness;
    a topmost surface of the substrate having conductive pads, configured and arranged for coupling to integrated circuit chips;
    a lower surface of the substrate having conductive pads, configured and arranged for coupling to external circuits;
    a conductive interconnect system having a through via extending along substantially the same axis from the topmost surface of the substrate to the lower surface of the substrate such that the through via physically contacts the conductive pads on the lower surface and physically contacts the conductive pads on the topmost surface such that the conductive pads on the lower surface are coupled with the conductive pads on the topmost surface, the through via configured and arranged for passing signals between the conductive pads on the lower surface and the conductive pads on the topmost surface;
    a carbon nanotube layer in the substrate, vertically between the topmost and lower surfaces, and extending laterally across at least a portion of the substrate, the carbon nanotube layer including carbon nanotubes configured and arranged for at least one of: structurally supporting the substrate and conducting heat in the substrate, wherein the carbon nanotube layer includes an upper portion having a first set of carbon nanotubes elongated in a first direction, a lower portion having a second set of carbon nanotubes elongated in the first direction, and a middle portion extending from the upper portion to the lower portion and having a third set of carbon nanotubes elongated in a second direction that is substantially perpendicular to the first direction, wherein the first set of carbon nanotubes are disposed closer to the topmost surface of the substrate having conductive pads than the second and third sets of carbon nanotubes and wherein the first set of carbon nanotubes are disposed over the second and third sets of carbon nanotubes, wherein at least one carbon nanotube from the third set of carbon nanotubes physically contacts at least one carbon nanotube from the first set of carbon nanotubes;

wherein the through via extends through the carbon nanotube layer and is electrically insulated from the carbon nanotubes, wherein a portion of the through via extending along the axis physically contacts at least one of the conductive pads on the topmost surface.

16. The arrangement of claim 15, wherein the carbon nanotubes are configured and arranged for conducting heat away from a selected portion of the substrate.

17. The arrangement of claim 16, wherein the carbon nanotubes are configured and arranged for conducting heat away from the through via extending through the carbon nanotube layer.

18. The arrangement of claim 15, wherein the carbon nanotube layer includes, at a location which the through via extends through, insulative material configured and arranged to electrically insulate the carbon nanotubes from the through via.

19. The arrangement of claim 15, wherein the carbon nanotube layer is configured and arranged to provide substantial structural support for the substrate.

20. The arrangement of claim 15, wherein the carbon nanotube layer comprises substantially the entire substrate and wherein the conductive interconnect system is in the carbon nanotube layer.

21. The arrangement of claim 15, wherein the at least one carbon nanotube from the third set of carbon nanotubes physically contacts at least one carbon nanotube from the second set of carbon nanotubes.

22. A method for manufacturing an integrated circuit substrate for transferring heat, the method comprising:

providing a substrate having a topmost surface that includes conductive pads configured and arranged for coupling to integrated circuit chips and a lower surface having conductive pads configured and arranged for coupling to external circuits;

creating a through via extending along a straight line from the topmost surface of the substrate to the lower surface of the substrate such that the through via physically contacts the conductive pads along the straight line on the lower surface and physically contacts the conductive pads along the straight line on the topmost surface, the through via configured and arranged for passing signals between the conductive pads on the lower surface and the conductive pads on the topmost surface; and characterizing heat-generating components of the integrated circuit substrate; and arranging carbon nanotube structures in the substrate to create a carbon nanotube layer that transfers heat away from the heat-generating components, wherein the through via extends through the carbon nanotube layer, wherein the carbon nanotube layer is non-electrically conductive, wherein the carbon nanotube layer includes an upper portion having a first set of carbon nanotubes elongated in a first direction, a lower portion having a second set of carbon nanotubes elongated in the first direction, and a middle portion extending from the upper portion to the lower portion and having a third set of carbon nanotubes elongated in a second direction that is substantially perpendicular to the first direction, wherein the first set of carbon nanotubes are disposed closer to the topmost surface of the substrate that includes conductive pads than the second and third sets of carbon nanotubes, wherein at least one carbon nanotube from the third set of carbon nanotubes physically contacts at least one carbon nanotube from the first set of carbon nanotubes and wherein the at least one carbon nanotube from the third set of carbon nanotubes physically contacts at least one carbon nanotube from the second set of carbon nanotubes.

23. The method of claim 22, wherein arranging carbon nanotube structures in the substrate to transfer heat away from the heat-generating components includes arranging a first end of a carbon nanotube structure immediately adjacent a heat-generating component and arranging a second end of the carbon nanotube structure in a location amenable to the removal of heat from the substrate.

24. The method of claim 23, further comprising arranging carbon nanotubes, having a length substantially greater than width, in the carbon nanotube layer in a direction generally parallel to the direction between the first and second ends to facilitate heat transfer along the length of the carbon nanotubes.

* * * * *